United States Patent [19]

Tigelaar

[11] Patent Number: 5,455,184
[45] Date of Patent: Oct. 3, 1995

[54] METHOD OF MAKING HIGH SPEED EPROM CONTAINING GRADED SOURCE/DRAIN PROFILE

[75] Inventor: Howard L. Tigelaar, Allen, Tex.

[73] Assignee: Texas Instruments Incorporated, Dallas, Tex.

[21] Appl. No.: 846,736

[22] Filed: Mar. 5, 1992

Related U.S. Application Data

[60] Continuation of Ser. No. 697,147, May 8, 1991, abandoned, which is a division of Ser. No. 494,784, Mar. 12, 1990, Pat. No. 5,016,215, which is a continuation of Ser. No. 102,993, Sep. 30, 1987, abandoned.

[51] Int. Cl.$^6$ .............. H01L 21/336; H01L 21/8247
[52] U.S. Cl. .............................. 437/30; 437/43
[58] Field of Search ................ 437/29, 43, 48, 437/30

[56] References Cited

U.S. PATENT DOCUMENTS

| | | | |
|---|---|---|---|
| 4,019,198 | 4/1977 | Endo et al. ................. | 357/23.5 |
| 4,173,791 | 11/1979 | Bell ............................ | 365/182 |
| 4,282,446 | 8/1981 | McElroy ..................... | 307/238.5 |
| 4,332,077 | 6/1982 | Hsu ............................ | 437/43 |
| 4,336,603 | 6/1982 | Kotecha et al. ............. | 365/182 |
| 4,366,555 | 12/1982 | Hu ............................. | 365/185 |
| 4,409,723 | 10/1983 | Harari ......................... | 29/571 |
| 4,575,920 | 3/1986 | Trunashima ................. | 437/29 |
| 4,590,503 | 5/1986 | Harari et al. ................ | 357/23.6 |
| 4,612,212 | 9/1986 | Masuoka et al. ............ | 437/43 |
| 4,617,479 | 10/1986 | Harrtmann et al. ......... | 307/465 |
| 4,620,361 | 11/1986 | Matsukawa et al. ......... | 437/43 |
| 4,639,893 | 1/1987 | Eitan .......................... | 365/185 |
| 4,665,418 | 5/1987 | Mizutani .................... | 357/23.5 |
| 4,698,787 | 10/1987 | Mukherjee et al. ......... | 357/23.5 |
| 4,727,038 | 2/1988 | Watabe et al. .............. | 437/29 |
| 4,764,477 | 8/1988 | Chang et al. ............... | 437/29 |
| 4,797,856 | 1/1989 | Lee et al. ................... | 365/185 |
| 4,814,286 | 3/1989 | Tam ........................... | 437/43 |

FOREIGN PATENT DOCUMENTS

| | | | |
|---|---|---|---|
| 62-125676 | 6/1987 | Japan ........................ | 437/43 |

OTHER PUBLICATIONS

"Waferscale's 256K EPROM Runs Superfast", Electronics, Jul. 9, 1987, pp. 65–66.

*Primary Examiner*—Olik Chaudhuri
*Attorney, Agent, or Firm*—W. James Brady, III; Richard L. Donaldson

[57] ABSTRACT

An EPROM memory cell (32) stores information in a floating gate (44) which overlies a portion of a channel between a program drain (36) and a read drain (34). A control gate (46) has a lower segment (48) which overlies the portion of the channel not covered by the floating gate (44), and has an upper portion (50) overlying the floating gate (44). During a program operation, electrons flow from the read drain (34), acting as a source, to the program drain (36), and hot electrons are stored within the floating gate (44). During a read operation, electrons flow from the programming gate (36) to the read gate (34), and the majority of hot electrons drift to the control gate (46). Since the hot electrons do not enter the floating gate (44) during read operations, a higher driving current can be used, thereby increasing the speed at which the EPROM memory cell (32) is read.

13 Claims, 1 Drawing Sheet

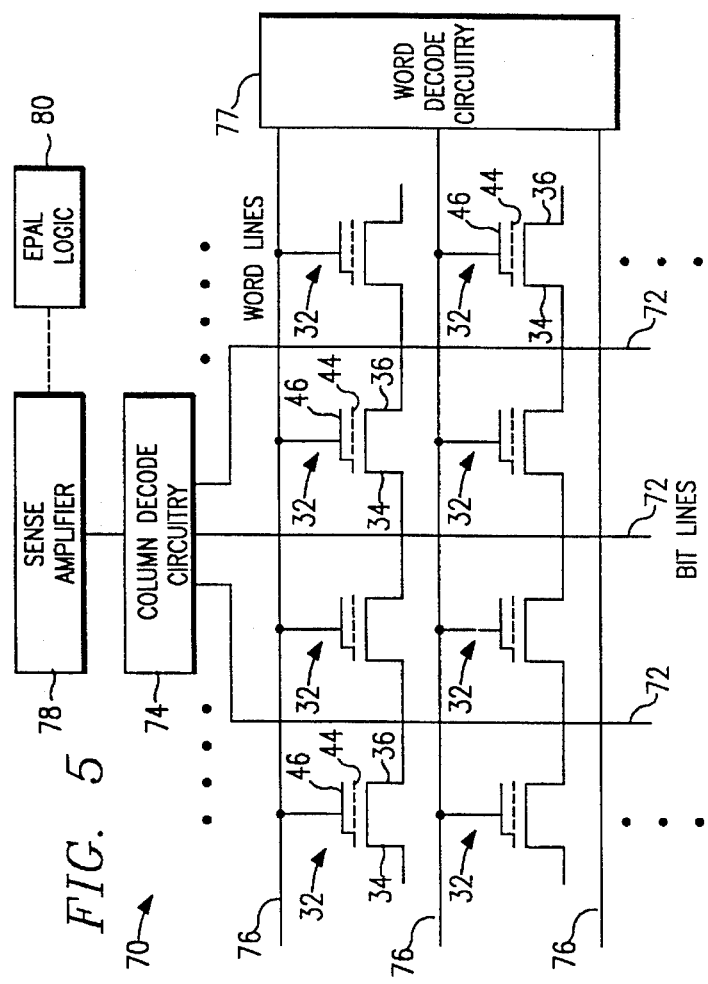
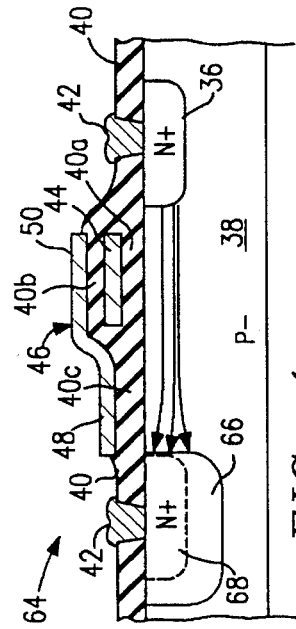
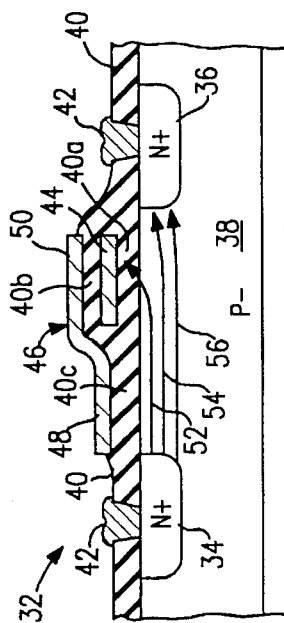
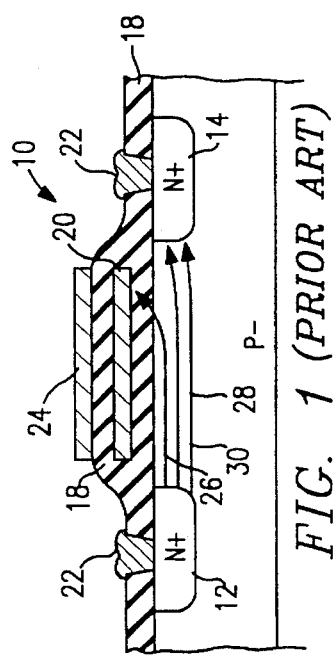

METHOD OF MAKING HIGH SPEED EPROM CONTAINING GRADED SOURCE/DRAIN PROFILE

This application is a Continuation of application Ser. No. 07/697,147, filed May 8, 1991 now abandoned which is a divisional of Ser. No. 494,784, filed Mar. 12, 1990, now U.S. Pat. No. 5,016,215 which is a continuation of Ser. No. 102,993, filed Sep. 30, 1987, now abandoned.

TECHNICAL FIELD OF THE INVENTION

This invention relates generally to semiconductor memories, and more particularly to a method and apparatus for reading and writing information into an EPROM cell using a high driving current.

BACKGROUND OF THE INVENTION

Currently available EPROMs have access times in the 150–200 nanosecond range. As processing circuits have increased in speed, it is desirable that the access rate for EPROMs also be increased.

The access time for EPROMs is particularly important in the field of Electrically Programmable Array Logic, otherwise known as EPAL. In EPAL, the speed at which the logic can function is dependent on how fast the internal EPROM can be read. Thus, the reading speed of the EPROM has a direct correlation to the speed of the EPAL.

Previous solutions to increase the access rate of EPROMs have produced deleterious side effects. The main impediment to increasing EPROM speed is control of "hot electrons," which pass through the oxide above the depletion region into a floating gate. To program the EPROM, hot electrons are purposely forced into the floating gate to create a charge therein. However, during read operations, it is undesirable for hot electrons to penetrate into the oxide region or the floating gate, since the accumulated effect of the passing of hot electrons during read cycles will result in a charge being stored in floating gates which were not programmed, causing "read disturbs."

Although using a high driving current will increase the speed with which an EPROM can be read, the higher driving current produces more hot electrons, resulting in an increased rate of read disturbs. Furthermore, hot electrons can be caught in the oxide between the depletion region and the floating gate, causing breakdown of the oxide region over a period of time.

Previously developed methods of preventing false programming when using higher driving currents have resulted in EPROM cells with increased complexity, and increased size. The increased size of the EPROM results in less space remaining on the semiconductor chip in which to form the array logic. Therefore, currently developed EPALs face a trade-off between logic density and operating speed.

Thus, a need has arisen in the industry for an EPROM structure which allows fast reading access time without substantially increasing the size of the EPROM memory cells.

SUMMARY OF THE INVENTION

In accordance with the present invention, a method and apparatus for storing information is provided which substantially eliminates or prevents the disadvantages and problems associated with prior EPROM devices.

In a first aspect of the invention, an EPROM memory cell is provided having a substrate with source and drain regions formed therein. A floating gate in which information is to be stored is formed over a portion of the area between the source and drain regions. A control gate is formed such that it covers both the floating gate and the remaining portion of the area between the source and drain, such that a depletion region is defined thereunder. During programming, a voltage is placed on the control gate and on the source/drain region nearest the floating gate (the "programming drain"), such that electrons are attracted towards the programming drain and up into the floating gate. During a read operation, a voltage is placed on the control gate and the source/drain region furthest from the floating gate (the "read drain"), and information is read using standard EPROM sense amplifiers.

This aspect of the present invention has the technical advantage that during read operations, very few electrons gain enough energy from the electric field created by the voltage to the control gate to overcome the oxide potential barrier at the silicon surface while they are beneath the floating gate. The hot electrons which do overcome the oxide potential barrier normally do so beneath the portion of the control gate directly above the depletion region. Thus, the hot electrons cross the oxide barrier into the control gate, where they are harmlessly absorbed.

In a second aspect of the present invention, the reading drain is formed with a graded impurity concentration profile, which decreases the electric field strength in the drain region by causing the voltage drop between the drain and channel to occur over a longer distance. Since the velocity of electrons is directly proportional to the electric field, less hot electrons are generated and less hot electrons are available to overcome the oxide potential barrier at the silicon surface. Therefore, less electrons enter the oxide layer or the gate regions.

This aspect of the invention produces the technical advantage that fewer electrons reach the floating gate and also reduces the number of electrons which are trapped in the oxide layer over time, thereby reducing damage to the oxide layer.

In a third aspect of the present invention, the implant normally used to raise the erased voltage threshold is omitted, since the channel of a deselected memory cell of the present invention cannot inadvertently turn on due to a capacitively coupled floating gate. Because the erased vt can remain at a natural vt of about 0.6 volts, the drive current is raised and the speed increased. Also, the complexity of the circuit is reduced.

BRIEF DESCRIPTION OF THE DRAWINGS

For a more complete understanding of the present invention and the advantages thereof, reference is now made to the following description now taken in conjunction with the accompanying drawings in which:

FIG. 1 illustrates a cross-sectional view of a prior art EPROM memory cell;

FIG. 2 illustrates a cross-sectional view of a first embodiment of the EPROM cell of present invention, indicating the flow of electrons during a program cycle;

FIG. 3 illustrates a cross-sectional view of the first embodiment of the EPROM cell of the present invention, indicating the flow of electrons during a read cycle;

FIG. 4 illustrates a cross-sectional view of a second embodiment of the EPROM cell of present invention, using a graded read drain; and FIG. 5 illustrates an array of EPROM cells of the present invention.

DETAILED DESCRIPTION OF THE INVENTION

The preferred embodiment of the present invention is best understood by referring to FIGS. 1–5 of the drawings, like numerals being used for like and corresponding parts of the various drawings.

FIG. 1 illustrates a typical prior art EPROM memory cell. The EPROM memory cell 10 comprises N+ source/drain regions 12 and 14 formed in a P− substrate 16. A dielectric oxide layer 18 is formed above the surface of the substrate 16 and encloses a floating gate region 20. Contacts 22 are formed through the oxide layer 18 to provide an electrical connection with the source/drain regions 12 and 14. A control gate 24 is formed above the floating gate 20, being separated from the floating gate 20 by the oxide layer 18.

The EPROM memory cell 10 is structurally similar to an N-channel transistor, with the addition of the floating gate 20 formed between the control gate 24 and the surface of the substrate 16. The EPROM memory cell 10 stores information by charging the floating gate 20, which is isolated electrically by the surrounding isolating oxide layer 18.

The floating gate 20 is programmed (written to) by accumulating negative charge on the floating gate through hot-electron channel injection. Typically, to charge a floating gate, a voltage of approximately 12.5 volts is placed on the control gate 24 to form a depletion region or channel between the source/drain regions 12 and 14 thereunder. One of the source/drain regions 12 or 14 (shown in FIG. 1 as drain region 14) is pulsed at approximately ten volts, while the other source/drain region (shown in FIG. 1 as source region 12) is held at ground. This produces a flow of electrons from source 12 to drain 14 as in a N-channel transistor. Because of the high electric field created by the charge on the control gate 24, some of the electrons flowing from source 12 to drain 14 will gain sufficient energy to penetrate the oxide layer 18 and drift into the floating gate 20, as depicted by arrow 26. The remaining electrons will be absorbed by the drain 14 as depicted by arrows 28 and 30.

Over a short period of time, sufficient charge will build up in the floating gate 20 such that the threshold voltage (voltage necessary to form a depletion region) becomes more positive. For a programmed memory cell, threshold voltage is approximately seven volts. For an unprogrammed memory cell, the threshold voltage is approximately 1.5 volts. Thus, to read the memory cell 10, an intermediate voltage of three volts is placed on the control gate 24 and 1.5 volts are placed on the drain 14. If the memory cell 10 is programmed, the memory cell 10 will not conduct from source 12 to drain because the voltage threshold of seven volts was not overcome. On the other hand, if the memory cell 10 is unprogrammed, the three volts on the control gate 24 will be sufficient to overcome the threshold voltage of 1.5 volts, and current will flow from source 12 to drain 14. The conduction of current between the source/drain regions 12 and 14 can be detected by a sense amplifier connected to the drain 14.

The speed at which the memory cell 10 is read could be improved by increasing the driving current, i.e., by increasing the voltage on the control gate 24 and the drain 14. However, increasing the driving current also increases the number of hot electrons generated during the read operation. Thus over a number of reads, an unprogrammed floating gate 20 may accumulate charge, thus raising the threshold voltage. At some point, the voltage threshold will be raised to a level such that it will read as if it were programmed, otherwise known as a "read disturb."

This problem can be overcome by the first embodiment memory cell of the present invention illustrated in FIGS. 2 and 3, showing the memory cell of the present invention during a programming cycle and during a read cycle, respectively. The EPROM memory cell 32 of the present invention has a N+ source/drain region 34, hereinafter "read drain" 34, and a N+ source/drain region 36, hereinafter "program drain" 36, formed in a P− substrate 38. An oxide layer 40 is formed over the surface of the substrate 38. Contacts 42 are formed through the oxide layer 40 to the read drain 34 and the program drain 36. A floating gate 44 is formed within the oxide layer 40 and is placed over a first portion of the area or channel region between the read drain 34 and program drain 36. A control gate 46 is formed on top of the oxide layer 40 having a lower portion or second segment 48 disposed above a second portion of the channel region between drains 34 and 36 and an upper portion or first segment 50 disposed above the floating gate 44.

The prior art EPROM memory cell has another problem associated with its use in an array. To select a particular cell for programming, a voltage is applied to the drains 14 of a number of cells, and a voltage is also applied to the control gate 24 of the selected cell. Due to capacitive coupling between the floating gate 20 and the drain 14 of each cell, the voltage on the floating gate 20 may rise above the natural threshold voltage of 0.6 volts, causing the channel to turn on without a voltage applied to the control gate 24. If the memory cell 10 turns on, large undesirable currents may flow within deselected cells, possibly preventing the selected memory cell 10 from programming. In order to prevent this unwanted drain coupled turn-on, a boron implant is generally used to raise the threshold voltage to a level of about 1.5 volts, above the voltage likely to be obtained by the floating gates 20. The implantation further reduces the driving current, and thus, the speed at which the memory cell can be read.

FIG. 2 illustrates the memory cell 32 of the present invention during a program cycle with arrows 52, 54 and 56 indicating the flow of electrons. During a program cycle, the control gate 46 and the program drain 36 are biased in the same manner as described in connection with FIG. 1. With a 12.5 voltage applied to the control gate 46 and 10 volts applied to the program drain 36, electrons flow from the read drain 34, acting as a source, to the program drain 36. The electric field created by the control gate 46 will create hot electrons which penetrate the oxide layer 40 and drift to the floating gate 44 where they are stored as illustrated by arrow 52. Hence, during the program cycle, the memory cell 32 of the present invention operates similarly to the prior art memory cell 10.

In FIG. 3, the memory cell 32 of the present invention is illustrated during a read operation with arrows 58, 60 and 62 indicating the flow of electrons. During the read cycle, a voltage below the threshold voltage of approximately seven volts may be placed on the control gate 46. In the preferred embodiment, this voltage is approximately five volts. Similarly, five volts is placed on the read drain 34, thus inducing a current from the program drain 36, acting as a source, to the read drain 34. Because of the greater driving current produced by the higher voltages on the control gate 46 and the read drain 34, some hot electrons will be produced. However, these hot electrons will penetrate the oxide layer 40 at a region below the lower portion 48 of the control gate 46 as indicated by arrow 58. Thus, the hot electrons will be absorbed by the control gate 46, rather than the floating gate 44. Despite the higher driving current, only an insubstantial number of hot electrons will reached the floating gate 44;

however, the higher driving current will allow the sense amplifier to sense a current in the memory cell 32 more quickly.

It is estimated that the memory cell of the present invention can increase drive current during read operations by three times. This provides the technical advantage that the EPROM memory cell of the present invention can provide greater speed without appreciably increasing the cell area or producing more read disturbs.

The memory cell of the present invention may be formed using the standard lithographic techniques used to produce prior art EPROM memory cells. After forming moat isolation in the usual manner, the gate oxide 40a is formed on the surface of the substrate 38 and the floating gate is deposited, preferably using doped polysilicon. The interlevel dielectric 40b is deposited preferably using ONO (oxide/nitride/oxide), and the ONO/polysilicon stack is etched. The pass gate oxide 40c is then grown and the control gate material, preferably doped polysilicon, is deposited, patterned, and etched, forming the gate structure shown in FIGS. 2–4. Subsequently, source/drain regions 34 and 36 are implanted and self-aligned to the gate.

FIG. 4 illustrates an alternative embodiment of the EPROM memory cell of the present invention. In this embodiment, the memory cell 64 has a read drain 66 having a graded impurity concentration profile, as compared to a normal source/drain region 68 illustrated in phantom. Graded read drain 66 extends deeper into substrate 38 than source/drain region 36. During a read operation, the graded read drain 66 spreads out the field of electrons passing from program drain 36, acting a source, to the graded read drain 66. The increased depletion region created by the graded read drain 66 decreases the electric field strength in the drain region by causing the voltage drop between the drain 66 and the channel to occur over a longer distance. Since the velocity of electrons is directly proportional to the electric field, less hot electrons are generated. Hence, a number of hot electrons which would have otherwise penetrated the oxide layer 40, are reduced.

The graded drains may be formed by implanting a high dose of arsenic (approximately $5\times10^{15}/cm^2$) and a lower dose of phosphorus (approximately $5\times10^{14}/cm^2$). During a high temperature anneal, the phosphorus diffuses faster than the arsenic, thereby resulting in a high concentration of phosphorus and arsenic at the surface and a gradually decreasing concentration of phosphorus beneath the surface.

This embodiment of the present invention produces several technical advantages. First, by spreading out the electron field at the read drain 66, fewer hot electrons will be generated to penetrate the oxide layer 40. Penetration of the oxide layer 40 can be undesirable, since some hot electrons become trapped in the oxide layer 40 without drifting to either the floating gate 44 or the control gate 46. This eventually produces breakdown of the oxide layer 40, rendering the cell inoperable. Because the memory cell 68 reduces the number of hot electrons penetrating the oxide layer 40 during read operations, a more reliable cell is produced.

It should be noted that the graded drain 66 could also be used with the prior art EPROM memory cell 10. In this instance, the number of hot electrons would be reduced by the graded drain, thereby allowing a higher driving current to be used in reading the cell. If a graded drain is used, reading must be performed with the flow of electrons towards the graded drain, and programming must be performed with the flow of electrons away from the graded drain.

FIG. 5 illustrates the EPROM memory cell 32 of the present invention in a memory array, which also could be used for the memory cell 64 of the second embodiment. The array 70 is comprised of a plurality of memory cells 32 (or 64). The source/drain regions 34 and 36 are connected to bitlines 72 controlled by column decode circuitry 74. Wordlines 76 are connected to the control gate 46 of the memory cells 32 and to word decode circuitry 77. A sense amplifier 78 is connected to the column decode, to sense current between chosen bitlines 72. If the EPROM memory array 70 is part of an EPAL circuit, then the sense amplifier 78 is connected to the EPAL logic 80.

In operation, individual memory elements are accessed by applying a voltage to a desired wordline 76 and to the bitlines 72 connected to the read drain 34 and write drain 36 of the selected memory cell 32. During a read operation, a voltage would be placed on the read drain 34 and ground voltage would be placed on the program drain 36, which is acting a source. The remaining bitlines 72 would float during the read operation. The column decode circuitry 74 connects the bitlines associated with the selected cell to the sense amplifier 78, which determines whether or not the cell has been programmed by sensing current between the bitlines 72.

During a write operation, the bitline 72 connected to the program drain 36 of the selected memory is connected to a positive voltage, while the read drain 34, acting as a source, is connected to ground. Once again, the remaining bitlines 72 are floated during the programming operation. The resultant current between source and drain results in hot electrons drifting to the floating gate Due to the design of the floating gate of the memory cell of the present invention, the drain coupled turn-on, described in connection with FIG. 1, cannot occur. Since the floating gate 44 covers only a portion of the channel between the source/drain regions 34 and 36, a capacitive voltage on the floating gate 44 is insufficient to cause conductance between the source/drain regions 34 and 36. Therefore, it is not necessary to perform an implantation to raise the voltage threshold, as is the case with the prior art transistor. Thus, the driving current is further increased, thereby further increasing the speed at which the memory cell of the present invention can be read. Also, the complexity of forming the memory cell is reduced.

Although the present invention has been described in detail, it should be understood that various changes, substitutions and alterations can be made herein without departing from the spirit and scope of the invention as defined by the appended claims.

What is claimed is:

1. A method of forming an electrically programmable memory cell comprising the steps of:

forming a first source/drain region in a substrate, said first source/drain region having a first impurity profile;

forming a second source/drain region in said substrate, said second source/drain region having a second impurity profile, said second impurity profile being more graded than said first impurity profile, said first and second source/drain regions separated by a channel region in said substrate, said channel region including a first portion adjacent to said first source/drain region and a second portion adjacent to said second source/drain region;

forming a conductive floating gate insulated from and adjacent said first portion of said channel region; and forming a conductive control gate having a first segment insulated from and adjacent said floating gate and a second segment insulated from and adjacent said second portion of said channel.

2. The method of claim 1, in which said step of forming a second source/drain region includes implanting a first impurity having a slow diffusion rate and a second impurity having a faster diffusion rate in said substrate.

3. The method of claim 2 wherein said step of forming a second source/drain region includes using arsenic as said first impurity and phosphorus as said second impurity.

4. The method of claim 1, in which said step of forming a second source/drain region includes implanting arsenic at a dose of approximately $5 \times 10^{15}/cm^2$ and phosphorus at a dose of approximately $5 \times 10^{14}/cm^2$ in said substrate.

5. The method of claim 4, in which said step of forming a second source/drain region includes performing a high temperature anneal to produce a high concentration of phosphorus and arsenic at a surface of said substrate and a gradual decreasing concentration of phosphorus beneath the surface.

6. The method of claim 1, in which said second source/drain region extends deeper into said substrate than said first source/drain region.

7. A method of forming an electrically programmable memory cell at the face of a substrate, comprising the steps of:

forming a floating gate insulated from and adjacent a first portion of a channel region in said face;

forming a control gate having a first segment insulated from and adjacent said floating gate and a second segment insulated from and adjacent a second portion of said channel region, said second portion of said channel region adjacent said first portion of said channel region;

forming a first source/drain region in said substrate adjacent said first portion of said channel region, said first source/drain region having a first impurity profile; and forming a second source/drain region in said substrate adjacent said second portion of said channel region, said second source/drain region having a second impurity profile, said second impurity profile being more graded than said first impurity profile.

8. The method of claim 7, in which said step of forming a second source/drain region includes implanting arsenic at a dose of approximately $5 \times 10^{15} cm^2$ and phosphorus at a dose of approximately $5 \times 10^{14}/cm^2$ in said substrate.

9. The method of claim 8, in which said step of forming a second source/drain region includes performing a high temperature anneal to produce a high concentration of phosphorus and arsenic at a surface of said substrate and a gradual decreasing concentration of phosphorus beneath the surface.

10. The method of claim 7, in which said second source/drain region extends deeper into said substrate than said first source/drain region.

11. The method of claim 7, in which said step of forming a second source/drain region includes implanting a first impurity having a slow diffusion rate and a second impurity having a faster diffusion rate.

12. The method of claim 11, in which said first impurity is arsenic and said second impurity is phosphorus.

13. The method of claim 7, in which said first and second source/drain regions are self-aligned to the control gate.

* * * * *